United States Patent [19]

Uehara et al.

[11] Patent Number: 4,536,465
[45] Date of Patent: Aug. 20, 1985

[54] POSITIVE-WORKING PHOTOSENSITIVE COMPOSITION WITH O-QUINONE DIAZIDE AND ADMIXTURE OF RESINS

[75] Inventors: Masafumi Uehara, Koganei; Atsuo Yamazaki, Hinode; Kazuhiro Shimura, Hachioji, all of Japan

[73] Assignee: Konishiroku Photo Industry Co., Ltd., Japan

[21] Appl. No.: 456,442

[22] Filed: Jan. 7, 1983

[30] Foreign Application Priority Data

Jan. 8, 1982 [JP] Japan .................................. 57-1958

[51] Int. Cl.³ .............................................. G03C 1/60
[52] U.S. Cl. .................................... 430/192; 430/190; 430/191; 430/302; 430/326; 430/165
[58] Field of Search ............... 430/192, 191, 190, 189, 430/302, 326

[56] References Cited

U.S. PATENT DOCUMENTS

| 3,647,443 | 3/1972 | Rauner et al. | 430/190 |
| 3,802,885 | 4/1974 | Lawson et al. | 430/192 |
| 4,123,279 | 10/1978 | Kobayashi | 430/192 |
| 4,174,222 | 11/1979 | Komine et al. | 430/192 |
| 4,306,011 | 12/1981 | Uehara et al. | 430/190 |
| 4,460,674 | 1/1982 | Uehara et al. | 430/191 |

FOREIGN PATENT DOCUMENTS

| 1075066 | 10/1976 | Canada | 430/191 |
| 2130283 | 12/1971 | Fed. Rep. of Germany | 430/192 |
| 50-8658 | 4/1975 | Japan | 430/192 |

Primary Examiner—Charles L. Bowers, Jr.
Attorney, Agent, or Firm—Finnegan, Henderson, Farabow, Garrett & Dunner

[57] ABSTRACT

A positive-working photosensitive composition comprising (a) an o-quinonediazide compound and (b) a condensed resin containing a condensation unit composed of an aromatic compound having a carboxylic group and a phenolic ahydroxyl group, and an aldehyde or ketone is disclosed. Said condensation unit has the following formula (I):

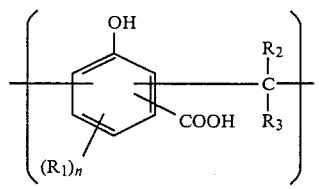

wherein $R_1$ is a hydrogen atom, a hydroxyl group, an acyloxy group, an alkyl group, an alkoxy group or a halogen atom, which may be the same or different when n is 2; $R_2$ and $R_3$ are each a hydrogen atom, a lower alkyl group having 1 to 4 carbon atoms, a phenyl group or a substituted phenyl group, which may be the same or different; and n is 1 or 2.

11 Claims, No Drawings

POSITIVE-WORKING PHOTOSENSITIVE COMPOSITION WITH O-QUINONE DIAZIDE AND ADMIXTURE OF RESINS

FIELD OF THE INVENTION

The present invention relates to a positive-working photosensitive composition adapted to the production of a lithographic printing plate, and fabrication of an integrated circuit or a photomask. More particularly, the invention relates to a positive-working photosensitive composition with improved sensitivity, developability and chemical resistance.

BACKGROUND OF THE INVENTION

Photosensitive compositions containing o-quinonediazide compounds as excellent positive-working photosensitive compositions, have been used in production of lithographic printing plates and photoresists. Although several proposals have been made for increasing the sensitivity of these quinonediazide-containing positive-working photosensitive compositions, none of them have proved satisfactory. By decreasing the content of the quinonediazide compound, the sensitivity of the composition is increased, but, at the same time, the latitude in development (the period during which optimum development is accomplished, and this is expressed in terms of the longest development time in which the number of clear stages on a gray scale for a given concentration of developing solution remains on a certain level) is narrowed. The apparent sensitivity of the quinonediazide compound is also increased by adding a binder resin having great solubility in an aqueous alkaline solution, but, again, this system has a narrow latitude in development.

Methods have been proposed for adding sensitizers to photosensitive compositions containing quinonediazide compounds to increase their sensitivity, but none have proved completely satisfactory, all methods being defective in one way or another. For instance, U.S. Pat. No. 3,661,582 describes a method for providing an increased sensitivity by adding certain heterocyclic compounds such as 2-azacyclononane-2-one, indole, quinazoline and tetrazole, but the resulting composition has an extremely small latitude in development.

Japanese Patent Publication No. 42449/71 teaches the use of various additives, say, triphenylmethane dyes, benzaldehydem-tolyhydrazone, hydrocarbon halides and azo dyes, to provide an increased photographic sensitivity, but none of these compounds are particularly effective in achieving the intended object.

The addition of o-benzoic acid sulfimide, hydantoin or its derivatives, and thiohydantoin or its derivatives to achieve the same object has also been proposed in Japanese Patent Application (OPI) No. 36203/75 (the symbol OPI as used herein means an unexamined published Japanese patent application). The addition of cyclic acid anhydrides is another means to attain the same purpose, as taught in Japanese Patent Application (OPI) No. 80022/77 and in Comparative Example 2 to be described hereinafter. In either case, the addition of the proposed compounds in the amount sufficient to achieve the intended increase in sensitivity only results in an extremely narrow latitude in development. Japanese Patent Application (OPI) No. 54503/77 discloses a photosensitive copying material containing polyhydroxybenzophenone, but this compound is added primarily for the purpose of improving the adhesion to a photographic support, and no great increase in the sensitivity of the copying material is attained. Also, increased sensivivity can be realized by adding a condensation product of hydroxybenzophenone and formaldehyde as described in Japanese Patent Application (OPI) No. 73045/80 and in Comparative Example 3 to be given hereinafter, but, in this case, like the compound disclosed in Japanese Patent Application (OPI) No. 54503/77, the condensation product must be added in a considerable amount to realize the desired increase in sensitivity, and this unavoidably reduces the latitude in development and the chemical resistance.

SUMMARY OF THE INVENTION

Therefore, an object of the present invention is to provide a positive-working photosensitive composition containing a quinonediazide compound that has been improved in sensitivity without causing deleterious effects on other important characteristics such as latitude in development and chemical resistance.

Another object of the invention is to provide a positive-working photosensitive composition which is superior in developability, particularly developability with a developing solution of low alkali concentration.

Other objects of the invention will be apparent by reading the following description.

As a result of various studies to attain these objects, we have found that they can be achieved by a positive-working photosensitive composition comprising (a) an o-quinonediazide compound and (b) a condensed resin containing a condensation unit composed of an aromatic compound having a carboxyl group and a phenolic hydroxyl group and an aldehyde or ketone.

DETAILED DESCRIPTION OF THE INVENTION

The aromatic compound having a carboxyl group and a phenolic hydroxyl group according to the present invention contains in its molecule an aromatic ring substituted by at least one hydroxyl group and the same or another aromatic ring substituted by at least one carboxyl group. Preferred aromatic rings are aryl groups such as a phenyl group and a naphthyl group. The carboxyl group may be bonded to the aromatic ring either directly or through a linking group. One to three hydroxyl groups are preferably bonded to one aromatic ring. One or two carboxyl groups are preferably contained in the aromatic compound according to the present invention. An example of the linking group through which the carboxyl group may be bonded to the aromatic ring is an alkylene group having 1 to 4 carbon atoms. For being condensed with an aldehyde or ketone, the aromatic compound described above must have at least two unsubstituted sites on the aromatic ring of one or more aryl groups substituted by at least one hydroxyl group.

Illustrative aromatic compounds that can be used in the present invention and which contain a carboxylic group and a phenolic hydroxyl group in the molecule include salicylic acid, 4-methylsalicylic acid, 6-methylsalicylic acid, 4-ethylsalicylic acid, 6-propylsalicylic acid, 6-laurylsalicylic acid, 6-stearylsalicylic acid, 4,6-dimethylsalicyclic acid, p-oxybenzoic acid, 2-methyl-4-oxybenzoic acid, 6-methyl-4-oxybenzoic acid, 2,6-dimethyl-4-oxybenzoic acid, 2,4-dioxybenzoic acid, 2,4-dioxy-6-methylbenzoic acid, 2,6-dioxybenzoic acid, 2,6-dioxy-4-methylbenzoic acid, 4-chloro-2-6,dioxybenzoic acid, 4-methyoxy-2,6-dioxybenzoic acid, gallic acid, fluoroglucinecarboxylic acid, 2,4,5-trioxybenzoic acid, m-galloyl gallic acid, tannic acid, m-benzoyl gallic acid, m-(p-toluyl) gallic acid, protocatechuoyl-gallic acid, 4,6-dioxyphthalic acid, (2,4-dioxyphenyl)acetic acid, (2,6-dioxyphenyl)acetic acid, and (3,4,5-trioxyphenyl)acetic acid, and, of these, gallic acid, tannic acid, m-galloyl gallic acid and phloroglucinal carboxylic acid are particularly preferred.

Preferred aldehydes for use in the present invention include aliphatic aldehydes and aromatic aldehydes. Preferred ketones include aliphatic ketones such as acetone, and aromatic ketones such as benzophenone and acetophenone. More specific examples of the aldehyde are formaldehyde, acetaldehyde, propionaldehyde, butyl aldehyde, isobutyl aldehyde, n-hexyl aldehyde, cyclohexane carbaldehyde, acrolein, crotonaldehyde, furfural, benzaldehyde, p-oxybenzaldehyde, o-tolualdehyde, p-tolualdehyde, o-anisaldehyde, p-anisaldehyde, p-chlorobenz-aldehyde, and p-nitrobenzaldehyde, and illustrative ketones are acetone, methyl ethyl ketone, acetophenone and benzophenone. Of these, formaldehyde and benzaldehyde are particularly preferred.

These aldehydes or ketones may be combined in any desired way with the aromatic compound having a carboxyl group and a phenolic hydroxyl group in the molecule, and two or more kinds of aldehydes or ketones may be condensed with two or more aromatic compounds, and vice versa. Condensable phenols that do not have a carboxyl group may also be used with the aromatic compound, and they include substituted phenols such as m-cresol and p-cresol, as well as resorcin and pyrogallol. In this case, the condensation unit composed of the aromatic compound having a carboxyl group and a phenolic hydroxyl group and an aldehyde or ketone may account for at least 10 mol %, preferably at least 30 mol %, of the composition.

The condensed resin used in the present invention contains the condensation unit composed of the aromatic compound and the aldehyde or ketone described above. Preferably, the resin contains a condensation unit of formula (I):

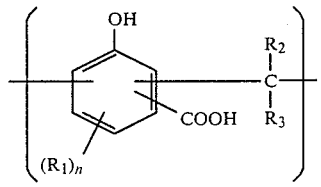

wherein $R_1$ is a hydrogen atom, a hydroxyl group, an acyloxy group, an alkyl group, an alkoxy group or a halogen atom, which may be the same or different when n is 2; $R_2$ and $R_3$ are each a hydrogen atom, a lower alkyl group having 1 to 4 carbon atoms, a phenyl group or a substituted phenyl group, which may be the same or different; and n is 1 or 2.

Examples of the acyloxy group represented by $R_1$ include an aliphatic carbonyloxy group, an alicyclic carbonyloxy group and an aromatic carbonyloxy group. The aliphatic ring may be either straight or branched, and the aromatic ring may be either unsubstituted or substituted by one or more groups selected from a hydroxyl group, an alkyl group, a carboxyl group, and a halogen atom. Illustrative acyloxy groups include acetyloxy, propionyloxy, butyryloxy, isobutyryloxy, valeryloxy, lauroyloxy, stearoyloxy, cyclohexylcarbonyloxy, benzoyloxy, p-toluoyloxy, p-hydroxybenzoyloxy, p-carboxybenzoyloxy, p-chlorobenzoyloxy and galloyloxy. Examples of the alkyl group also represented by $R_1$ include those which have 1 to 18, preferably 1 to 4, carbon atoms, and they may be straight or branched. Illustrative alkyl groups include methyl, ethyl, i-propyl, t-butyl, i-amyl, n-hexyl, n-octyl, lauryl, cetyl and stearyl. Examples of the alkoxy group also represented by $R_1$ include aliphatic alkoxy groups and aromatic alkoxy groups, which are more specifically illustrated by methoxy, ethoxy, i-propoxy, t-butoxy, phenoxy and benzyloxy. Examples of the halogen atom represented by R include fluorine, chlorine, bromine and iodine.

Examples of the lower alkyl group with 1 to 4 carbon atoms represented by $R_2$ or $R_3$ include methyl, ethyl, n-propyl, i-propyl n-butyl, t-butyl and i-butyl. Examples of the substituent for the substituted phenyl represented by $R_2$ or $R_3$ include a hydroxyl group, a lower alkyl group having 1 to 4 carbon atoms, an alkoxy group having 1 to 4 carbon atoms, a halogen atom (e.g. chlorine or bromine) and a nitro group. The condensed resin used in the present invention may also contain condensation units other than that mentioned above. Examples are mentioned below and they are condensation units composed of phenols (e.g. phenol, cresol, pyrogallol, resorcin and 4-4'-dihydroxydiphenyl ether) and aldehydes or ketones:

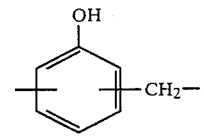

(1)

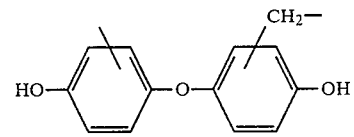

(2)

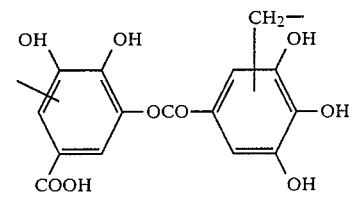

(3)

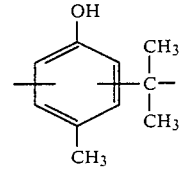

(4)

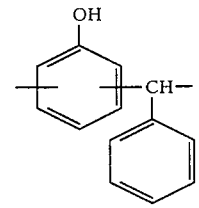

(5)

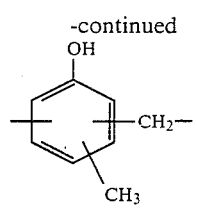 (6)

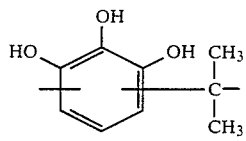 (7)

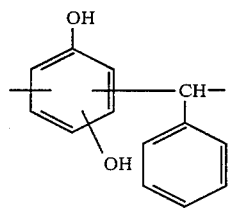 (8)

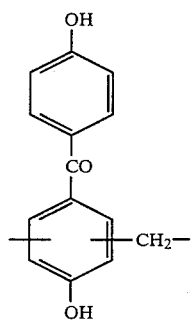 (9)

Examples of the condensed resin comprising the condensation unit composed of the aromatic compound having a carboxyl group and a phenolic hydroxyl group and an aldehyde or ketone (said resin being hereinafter referred to as a substituted phenolic resin) used in the present invention include salicylic acid-formaldehyde resin, salicyclic acid-m-cresol-formaldehyde resin, 4-methylsalicylic acid-formaldehyde resin, 6-propyl-salicylic acid-phenol-formaldehyde resin, 4,6-dimethylsalicylic acid-acetaldehyde resin, p-oxybenzoic acid-resorcin-benzaldehyde resin, 2-methyl-4-oxybenzoic acid-formaldehyde resin, 2,6-dimethyl-4-oxybenzoic acid-acetaldehyde resin, 2,4-dioxybenzoic acid-p-cresol-formaldehyde resin, 2,6-dioxybenzoic acid-butylaldehyde resin, 4-choloro-2,6-dioxybenzoic acid-m-cresol-formaldehyde resin, 4-methoxy-2,6-dioxybenzoic acid-formaldehyde resin, gallic acid-formaldehyde resin gallic acid-resorcin-formaldehyde resin, phloroglucinolcarboxylic acid-benzaldehyde resin, phloroglucinolcarboxylic acid-acetone resin, phloroglucinolcarboxylic acid-resorcin-benzophenone resin, 2,4,5-trioxybenzoic acid-furfural resin, galloyl gallic acid-pyrogallol-p-nitrobenzaldehye resin, tannic acid-resorcin-formaldehyde resin, tannic acid-m-cresol-formaldehyde resin, tannic acid-p-oxybenzoic acid-resorcin-formaldehyde resin, 4,6-dioxyphthalic acid-resorcin-formaldehyde resin, (2,4-dioxyphenol)acetic acid-propionaldehyde resin and (3,4,5-trioxyphenyl)acetic acid-m-cresol-formaldehyde resin. Particularly preferred are gallic acid-formaldehyde resin, tannic acid-resorcin-formaldehyde resin, gallic acid-resorcin-formaldehyde resin and phloroglucinol-carboxylic acid-benzaldehyde resin.

The substituted phenolic resin used in the present invention is typically produced by the following method: one mole of the aromatic compound having a carboxyl group and a phenolic hydroxyl group is condensed with 0.50 to 2.0 moles of the aldehyde or ketone in the absence or presence of a solvent such as alcohol or dioxane with the aid of a catalyst such as an acid (e.g. hydrochloric acid or oxalic acid) or an alkali (e.g. sodium hydroxide or aqueous ammonia solution. The molecular weight of the resin can be freely changed by varying the molar ratio of the monomers charged and the condensation conditions. For the purposes of the present invention, those resins having a molecular weight between about 400 and 10,000 are usable, but preferably those having a molecular weight between about 600 and 4,000 are suitable.

Typical examples of the substituted phenolic resin according to the present invention are produced by the following illustrative methods.

Synthesis 1

A mixture of 128 g (0.75 mole) of gallic acid and 27.5 g (0.25 mole) of resorcin was dissolved in 500 ml of ethanol. To the solution, 122 g (1.5 moles) of formalin (37% aqueous formaldehyde solution) and 0.5 mol of 35% concentrated hydrochloric acid (as catalyst) were added. Under stirring, the mixture was heated on an oil bath, and when the reaction mixture began to boil under reflux owing to the heat of reaction, some heat was removed and heating under reflux was continued further for 2.5 hours. After the reaction, the mixture was poured into 2,000 ml of cold water under stirring whereupon 150 g of a pale brown powder of gallic acid-resorcin-formaldehyde resin (molecular weight: about 1,600) was obtained.

Synthesis 2

After dissolving 170 g (1 mole) of gallic acid in 300 ml of ethanol and 162 g (2 moles) of formalin (37% aqueous formaldehyde solution) under heating, 0.5 ml of 35% concentrated HCl was added to the solution as a catalyst, and the mixture was heated under reflux for 4.5 hours with stirring. After the reaction, the mixture was poured into 2,000 ml of cold water under stirring, whereupon 110 g of a white powder of gallic acid-formaldehyde resin having a molecular weight of about 1,200 was obtained.

Synthesis 3

A mixture of 215 g (0.67 mole) of m-galloyl gallic acid and 37 g (0.33 mole) of resorcin was dissolved in 1,000 ml of dioxane and 122 g (1.5 moles) of formalin (37% aqueous formaldehyde solution) under stirring. Thereafter, 0.5 ml of 35% concentrated HCl was added to the solution as a catalyst, and the mixture was heated under reflux on an oil bath (135° to 145° C.) for 2.5 hours with stirring. After the reaction, the mixture was poured into 5,000 ml of cold water under stirring, whereupon 237 g of a pale brown powder of m-galloyl gallic acid-resorcin-formaldehyde resin having a molecular weight of about 2,100 was obtained.

Synthesis 4

A mixture of 170 g (1 mole) of fluoroglucinecarboxylic acid and 106 g (1 mole) of benzaldehyde was dissolved in 500 ml of dioxane under stirring. Then, 15 g of phosphorus oxychloride was added to the solution as a catalyst, and the mixture was stirred for 24 hours at room temperature. After the reaction, the mixture was poured into 2,000 ml of cold water under stirring whereupon 248 g of a pale brown powder of fluoroglucinecarboxylic acid-benzaldehyde resin having a molecular weight of about 1,800 was obtained.

Synthesis 5

A mixture of 116 g (0.75 mole) of 2,4-dioxybenzoic acid and 27.5 g (0.25 mole) of resorcin was dissolved in 500 ml of acetone. Then, 1 ml of 35% concentrated HCl was added to the solution as a catalyst, and the mixture was heated under reflux on an oil bath for 15 hours with stirring. After the reaction, the mixture was poured into 2,000 ml of cold water under stirring, whereupon 146 g of a pale brown powder of 2,4-dioxybenzoic acid-resorcin resin having a molecular weight of about 1,700 was obtained.

Other examples of the substituted phenolic resin according to the present invention can be prepared by analogous methods.

When the substituted phenolic resin of the present invention is used in admixture with an o-quinonediazide compound, the amount of the resin is generally from about 1 to 80 wt %, preferably from 2 to 50 wt %, of the total photosensitive composition. Examples of the o-quinonediazide compound used in the present invention include esters or amides of 1,2-diazobenzoquinonesulfonic acid chloride or 1,2-diazonaphthoquinonesulfonic acid chloride with compounds having a hydroxyl or amino group. Illustrative compounds having a hydroxyl or amino group include low-molecular compounds such as 2,3,4-trihydroxy-benzophenone, 1-naphthylamine and 2,2'-dihydroxy-dinaphthyl-(1,1')-methane, as well as alkali-soluble condensed resins produced by condensing phenols (e.g. phenol, cresol, pyrogallol and resorcin) and aldehydes (e.g. benzaldehyde and formaldehyde) or ketones (e.g. acetone and acetophenone). Esters of hydroxyl-containing resins which are insoluble or hardly soluble in aqueous alkali solutions and o-quinonediazide compounds having a halogenosulfonyl group may also be used with the ester of quinonediazide sulfonyl chloride with alkali-soluble condensed resin.

The quinonediazide compounds most preferred for use in the present invention are an ester of 1,2-diazobenzoquinonesulfonic acid chloride and polyhydroxyphenyl and an ester of 1,2-diazona-phthoquinonesulfonic acid chloride and resorcin-benzaldehyde resin, as described in Japanese Patent Applications (OPI) Nos. 1044/81 and 1045/81. Other preferred quinonediazide compounds are described in U.S. Pat. Nos. 3,046,120 and 3,188,210, and they are esters of 1,2-diazobenzoquinonesulfonic acid chloride or 1,2-diazonaphthoquinonesulfonic acid chloride with phenol-formaldehyde resin. Many other useful quinonediazide compounds are listed in the following patents: Japanese Patent Applications (OPI) Nos. 5303/72, 63802/73, 63803/73, 96575/73, 13354/73 and 38701/74; Japanese Patent Publications Nos. 11222/66, 28403/68, 9610/70 and 17481/74; U.S. Pat. Nos. 2,797,213, 3,454,400, 3,544,323, 3,573,917, 3,674,495 and 3,785,825; British Pat. Nos. 1,227,602, 1,251,345, 1,267,005, 1,329,888 and 1,330,932; and German Pat. No. 854,890.

The positive-working photosensitive composition of the present invention may contain another resin in addition to the substituted phenolic resin described above. Advantageous examples of such optional resin include novolak resins which are soluble or hardly soluble in aqueous alkaline solutions. Typical novolak resins include phenol-formaldehyde resins, cresol-formaldehyde resins, p-tert-butylphenol-formaldehyde resins, and phenol-modified xylene resins. The positive-working photosensitive composition contains 10 to 50 wt %, preferably 20 to 40 wt %, of the quinonediazide compound. The optional resins illustrated above is contained in an amount of 45 to 80 wt %, preferably 50 to 70 wt %, of the composition.

The positive-working photosensitive composition of the present invention may further contain a filler, colorant, dye, pigment, photo-decomposable acid providing agent, and surfactant for providing improved coating property, as well as other conventional additives and aids. While the content of these additives varies with their type, they are generally used in an amount of 0.01 to 20 wt %, preferably 0.05 to 10 wt %, of the positive-working photosensitive composition. Dyes preferred for use in the present invention are basic dyes and oil-soluble dyes. Illustrative basic dyes include Victoria Pure Blue BOH, Victoria Blue BH, Methyl Violet, and Aizen Malachite Green (all being products of Hodogaya Chemical Co., Ltd.); and Patent Pure Blue VX, Rhodamine B and Methylene Blue (all being the products of Sumitomo Chemical Co., Ltd.). Illustrative oil-soluble dyes include Sudan Blue II and Victoria Blue F4R (both being the products of BASF Aktiengesellschaft), and Oil Blue #603, Oil Blue BOS and OIL Blue IIN (all being the products of Orient Chemical Industry Co., Ltd.).

The photosensitive composition of the present invention is used in various applications after it is coated onto a support such as aluminum plate, zinc plate, copper plate, chrome-plated iron plate, plastic film, paper, laminated sheet such as bimetal, trimetal, PCB copper-plastic sheet, or glass sheet with vapor-deposited $Cr_2O_3$ coat. For providing improved adhesion to the photosensitive composition, such support may be surface-treated by electrical, mechanical and/or chemical means.

The photosensitive composition of the present invention is coated onto supports as it is dissolved in various organic solvents. Illustrative solvents include ethylene dichloride, cyclohexanone, methyl ethyl ketone, methyl cellosolve, ethyl cellosolve, methyl cellosolve acetate, ethyl cellosolve acetate, dioxane, ethyl acetate and dimethylformamide. These solvents may be used either alone or in admixture. The coating solution desirably has a solid content of from 1 to 50 wt %. The coating amount varies with the specific use of the composition, but it is usually in the range of from 0.5 to 3.0 g/m² on a dry basis. The composition can be applied to supports by any known coating technique.

The so prepared photosensitive material can be processed by any conventional method. For instance, a positive relief image may be produced by placing a transparency having an image such as a line image or halftone image in close contact with the photosensitive surface of the material, exposing to a light source, and developing. Suitable light sources include a mercury lamp, metal halide lamp, xenon lamp, chemical lamp and carbonarc lamp. Preferable developing solution is an aqueous alkaline solution. Illustrative aqueous alkaline solutions include those of sodium silicate, potassium silicate, sodium hydroxide, potassium hydroxide, sodium tertiary phosphate, sodium secondary phosphate, sodium carbonate and potassium carbonate. The concentration of the aqueous alkaline solutions varies with the type of the photosensitive composition and alkali, but it is generally in the range of from 0.1 to 10 wt %. The aqueous alkaline solutions may contain a surfactant or an organic solvent (e.g. alcohol) as required.

A photosensitive material, especially a lithographic printing plate, using the photosensitive composition of the present invention has a higher sensitivity than the one using the conventional positive-working photosensitive composition, and hence, the exposure of the material can be finished in a shorter time and the efficiency of overall processing is increased. The photosensitive composition containing the substituted phenolic resin according to the present invention has high developability and permits the use of a developing solution having a significantly reduced alkali concentration without decreasing the latitude in development and the chemical resistance of the composition.

As described above, the photosensitive composition of the present invention offers a very useful photosensitive material, particularly lithographic printing plate, having advantages that will not otherwise be enjoyed.

The present invention is now described in greater detail by reference to the following examples and comparative examples which are given here for illustrative purposes only and are by no means intended to limit the scope of the invention.

EXAMPLE 1

A photosensitive coating solution having the formulation indicated below was applied to an electrochemically grained and anodized aluminum plate in a dry weight of 2.5 g/m$^2$:

| | |
|---|---|
| 1,2-Naphthoquinone-2-diazido-5-sulfonate ester of resorcin-benzaldehyde resin [as described in Example 1 of U.S. Pat. No. 4306010] | 3.00 g |
| Cresol-formaldehyde resin | 9.00 g |
| Gallic acid-resorcin-formaldehyde resin prepared in Synthesis 1 | 1.20 g |
| Victoria Pure Blue BOH (dye produced by Hodogaya Chemical Co., Ltd.) | 0.12 g |
| Methyl cellosolve | 100 g |

A positive transparency placed in close contact with the surface of the resulting photosensitive plate was exposed to a metal halide lamp (2 kW) 70 cm distant for a period of 60 seconds, and thereafter it was developed with 2 wt % aqueous sodium metasilicate solution at 25° C. for a period of 45 seconds. The optimum exposure time was selected at such a point that the fifth stage on a gray scale (Sakura step tablet type TPS-A of Konishiroku Photo Industry Co., Ltd., with the difference in concentration between each stage being 0.15) became completely clear. The latitude in development (i.e. the longest development time in which the number of clear stages on the gray scale remained on the fifth stage as a result of development with the 2 wt % aqueous sodium metasilicate solution at 25° C.) of this photo-sensitive plate was 6 minutes.

The concentration of the sodium metasilicate in the developer was reduced until the plate protection ink stained the nonimage area of the exposed and developed printing plate. The stain was caused at a metasilicate concentration of 0.7 wt %. The printing plate so prepared was used in offset printing and copies with sharp and high-contrast image were produced.

COMPARATIVE EXAMPLE 1

A photosensitive plate was prepared as in Example 1 except that no gallic acid-resorcin-formaldehyde resin was contained in the coating solution. The plate was exposed and developed with 2 wt % aqueous sodium metasilicate as in Example 1. The optimum exposure time was 125 seconds. Apparently, the sensitivity of the plate of Example 1 that contained the gallic acid-resorcin-formaldehyde resin in the sensitive layer was more than twice the sensitivity of the plate of Comparative Example 1 which had no such resin. The latitude in development of the plate of Comparative Example 1 was 6 minutes, and this indicates that the addition of the gallic acid-resorcin-formaldehyde resin had no adverse effect on the latitude in development.

Then, the concentration of the sodium metasilicate in the developer was reduced until the plate protection ink stained the nonimage area of the exposed and developed printing plate. The stain was caused at a metasilicate concentration of 1.8 wt %.

The above data shows that the developability of a photosensitive composition can be significantly improved by adding the gallic acid-resorcin-formaldehyde resin to the photosensitive layer.

COMPARATIVE EXAMPLE 2

A photosensitive coating solution having the formulation indicated below was applied to an electrochemically grained and anodized aluminum plate in a dry weight of 2.3 g/m$^2$;

| | |
|---|---|
| 1,2-Naphthoquinone-2-diazido-5-sulfonate ester of resorcin-benzaldehyde resin [as described in Example 1 of U.S. Pat. No. 4306010] | 3.00 g |
| Cresol-formaldehyde resin | 9.00 g |
| Tetrahydrophthalic anhydride [as described in Example 1 of Japanese Patent Application (OPI) No.80022/77] | 1.20 g |
| Victoria Pure Blue BOH (dye produced by Hodogaya Chemical Co., Ltd.) | 0.12 g |
| Methyl cellosolve | 100 g |

The photosensitive plate thus prepared was exposed and developed with 2 wt % aqueous sodium metasilicate solution as in Example 1. The optimum exposure period was 85 seconds. The latitude in development was 3 minutes. The above data shows that a cyclic acid anhydride of the type used in this comparative example is effective in providing increased sensitivity, but that its effectiveness is not as great as that of the compound according to the present invention. Furthermore, such cyclic acid anhydride has noticeably adverse effect on the latitude in development.

COMPARATIVE EXAMPLE 3

A photosensitive coating solution having the formulation indicated below was applied to an electrochemically grained and anodized aluminum plate in a dry weight of 2.5 g/m$^2$:

| | |
|---|---|
| 1,2-Naphthoquinone-2-diazido-5-sulfonate ester of resorcin-benzaldehyde resin [as described in Example 1 of U.S. Pat. No. 4306010] | 3.00 g |
| Cresol-formaldehyde resin | 9.00 g |
| 2,3,4-Trihydroxybenzophenone-formaldehyde resin [as described in Japanese Patent | 1.20 g |

| | |
|---|---|
| Application (OPI) No. 73045/80] | |
| Victoria Pure Blue BOH (dye of Hodogaya Chemical Co., Ltd.) | 0.12 g |
| Methyl cellosolve | 100 g |

The photosensitive plate thus prepared was exposed and developed with 2 wt % aqueous sodium metasilicate as in Example 1. The optimum exposure time was 100 seconds, and the latitude in development was 6 minutes. The above data shows that although a hydroxybenzophenone-formaldehyde resin of the type used in this example has little adverse effect on the latitude in development, it is far less effective than the compound according to the present invention in improving the sensitivity.

EXAMPLE 2

A coating solution of the formulation indicated below was applied to an electrochemically-grained and anodized aluminum plate in a dry weight of 2.3 g/m$^2$:

| | |
|---|---|
| Ester of naphthoquinone-1,2-diazido-5-sulfonyl chloride and m-cresol-formaldehyde resin (as described in Example 3 of Japanese Patent Publication No. 9610/70) | 4.00 g |
| Cresol-novolak resin | 8.00 g |
| Gallic acid-formaldehyde resin | 1.60 g |
| Victoria Pure Blue BOH (dye of Hodogaya Chemical Co., Ltd.) | 0.06 g |
| Oil Blue 2N (dye of Orient Chemical Industry Co., Ltd.) | 0.04 g |
| Ethyl cellosolve | 100 g |

The photosensitive plate thus prepared was exposed and developed with 2 wt % aqueous sodium metasilicate as in Example 1. The optimum exposure time was 45 seconds and the latitude in development was 6 minutes. The printing plate so produced was used in offset printing and copies with sharp and high-contrast image were produced.

EXAMPLE 3

A photosensitive coating solution of the formulation indicated below was applied to a mechanically grained (with a nylon brush) and anodized aluminum plate in a dry weight of 2.1 g/m$^2$:

| | |
|---|---|
| Naphthoquinone-1,2-diazido-5-sulfonyl chloride esterified with resorcin-benzaldehyde resin | 3.50 g |
| Cresol-phenolnovolak resin | 8.50 g |
| m-Galloyl gallic acid-resorcin-formaldehyde resin | 1.20 g |
| Oil Blue #603 (dye of Orient Chemical Industry Co., Ltd.) | 0.07 g |
| Crystal Violet (dye of BASF Aktiengesellschaft) | 0.07 g |
| Methyl cellosolve | 90 g |
| Cyclohexanone | 10 g |

The photosensitive plate thus prepared was exposed and developed with 2 wt % aqueous sodium metasilicate as in Example 1. The optimum exposure time was 60 seconds and the latitude in development was 6 minutes. The printing plate so produced was used in offset printing and copies with sharp and high-contrast image were produced.

What is claimed is:

1. A positive-working photosensitive composition comprising in admixture (a) 10 to 50% by weight of an o-quinonediazide compound; (b) 1 to 80% by weight of a condensed resin containing a condensation unit composed of an aromatic compound having a carboxyl group and a phenolic hydroxyl group, and an aldehyde or ketone; and (c) 45 to 80% by weight of a novolak resin.

2. A positive-working photosensitive composition according to claim 1, wherein said aldehyde is formaldehyde or benzaldehyde.

3. A positive-working photosensitive composition according to claim 1, wherein said ketone is acetone.

4. A positive-working photosensitive composition according to claim 1, wherein said aromatic compound is a compound selected from the group consisting of salicylic acid, 4-methylsalicylic acid, 6-methylsalicylic acid, 4-ethylsalicylic acid, 6-propylsalicylic acid, 6-laurylsalicylic acid, 6-stearylsalicylic acid, 4,6-dimethylsalicyclic acid, p-oxybenzoic acid, 2-methyl-4-oxybenzoic acid, 6-methyl-4-oxybenzoic acid, 2,6-dimethyl-4-oxybenzoic acid, 2,4-dioxybenzoic acid, 2,4-dioxy-6-methylbenzoic acid, 2,6-dioxybenzoic acid, 2,6-dioxy-4-methylbenzoic acid, 4-chloro-2,6, dioxybenzoic acid, 4-methoxy-2,6-dioxybenzoic acid; gallic acid, phloroglucinolcarboxylic acid, 2,4,5-trioxybenzoic acid, m-galloyl gallic acid, tannic acid, m-benzoyl gallic acid, m-(p-toluyl)gallic acid, protocatechuoyl-gallic acid, 4,6-dioxyphthalic acid, (2,4-dioxyphenyl)acetic acid, (2,6-dioxyphenyl) acetic acid and (3,4,5-trioxyphenyl)acetic acid.

5. A positive-working photosensitive composition according to claim 4, wherein said aromatic compound is selected from the group consisting of gallic acid, tannic acid, m-galloyl gallic acid and phloroglucinol-carboxylic acid.

6. A positive-working photosensitive composition according to claim 1, wherein said condensation unit has the following formula (I):

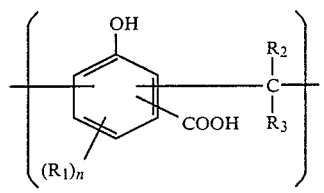

wherein R$_1$ is a hydrogen atom, a hydroxyl group, an acyloxy group, an alkyl group, an alkoxy group or a halogen atom, which may be the same or different when n is 2; R$_2$ and R$_3$ are each a hydrogen atom, a lower alkyl group having 1 to 4 carbon atoms, a phenyl group or a substituted phenyl group; R$_2$ and R$_3$ may be the same or different; and n is 1 or 2.

7. A positive-working photosensitive composition according to claim 1, wherein said condensed resin is selected from the group consisting of salicylic acid-formaldehyde resin, salicyclic acid-m-cresol-formaldehyde resin, 4-methylsalicylic acid-formaldehyde resin, 6-propyl-salicylic acid-phenol-formaldehyde resin,4,6-dimethylsalicylic acid-acetaldehyde resin, p-oxybenzoic acid-resorcin-benzaldehyde resin, 2-methyl-4-oxybenzoic acid-formaldehyde resin, 2,6-dimethyl-4-oxybenzoic acid-acetaldehyde resin, 2,4-dioxybenzoic acid-p-cresol-formaldehyde resin, 2,6-dioxybenzoic acid-butylaldehyde resin, 4-chloro-2,6-dioxybenzoic acid-m-cresol-formaldehyde resin, 4-methoxy-2,6-dioxybenzoic acid-formaldehyde resin, gallic acid-formaldehyde resin, gallic acid-resorcin-formaldehyde resin, phloroglucinol-carboxylic acid-benzaldehyde resin, phloroglucinolcarboxylic acid-acetone resin, phloroglucinolcarboxylic acid-resorcin-benzophenone resin, 2,4,5-trioxybenzoic acid-furfural resin, galloyl gallic acid-pyrogallol-p-nitrobenzaldehyde resin, tannic acid-resorcin-formaldehyde resin, tannic acid-m-cresol-formaldehyde resin, tannic acid-p-oxybenzoic acid-resorcin-formaldehyde resin, 4,6-dioxyphthalic acid-resorcin-formaldehyde resin, (2,4-dioxyphenol) acetic acid-propionaldehyde resin and (3,4,5-trioxyphenyl)acetic acid-m-cresol-formaldehyde resin.

8. A positive-working photosensitive composition according to claim 1, wherein said condensed resin is selected from the group consisting of gallic acid-formaldehyde resin, tannic acid-resorcin-formaldehyde resin, gallic acid-resorcin-formaldehyde resin and phloroglucinol-carboxylic acid-benzaldehyde resin.

9. A photosensitive lithographic printing plate material including a support having thereon a positive-working photosensitive composition comprising in admixture (a) 10 to 50% by weight of an o-quinone diazide compound (b) 1 to 80% by weight of a condensed resin containing a condensation unit composed of an aromatic compound having a carboxyl group and a phenolic hydroxyl group, and an aldehyde or ketone and (c) 45 to 80% by weight of a novolak resin.

10. A positive-working photosensitive composition according to claim 1, wherein the novolak resin is present within the range of 50 to 70% by weight.

11. A positive-working photosensitive composition according to claim 1, wherein the novolak resin is selected from the group consisting of phenol-formaldehyde resins, cresol-formaldehyde resins, p-tert-butylphenol-formaldehyde resins, and phenol-modified xylene resins.

* * * * *